(12) United States Patent
Landry

(10) Patent No.: US 6,466,505 B1
(45) Date of Patent: Oct. 15, 2002

(54) FLEXIBLE INPUT STRUCTURE FOR AN EMBEDDED MEMORY

(75) Inventor: Greg J. Landry, Merrimack, NH (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/848,568

(22) Filed: May 2, 2001

(51) Int. Cl.$^7$ .................................. G11C 7/00
(52) U.S. Cl. ........................ 365/219; 365/233
(58) Field of Search ............... 365/219, 233, 365/230.09, 230.01, 236, 230.08

(56) References Cited

U.S. PATENT DOCUMENTS

| | | | |
|---|---|---|---|
| 4,377,757 A | 3/1983 | Konemann et al. | 307/303 |
| 4,390,987 A | 6/1983 | Best | 370/112 |
| 4,645,944 A | 2/1987 | Uya | 307/243 |
| 4,670,749 A | 6/1987 | Freeman | 340/825.85 |
| 4,677,318 A | 6/1987 | Veenstra | 307/465 |
| 4,721,868 A | 1/1988 | Cornell et al. | 307/465 |
| 4,831,573 A | 5/1989 | Norman | 364/716 |
| 5,055,710 A | 10/1991 | Tanaka et al. | 307/303.1 |
| 5,352,940 A | 10/1994 | Watson | 307/465 |
| 5,394,031 A | 2/1995 | Britton et al. | 326/38 |
| 5,640,365 A * | 6/1997 | Imamiya et al. | 365/236 |
| 5,822,270 A * | 10/1998 | Park | 365/233 |
| 6,055,656 A | 4/2000 | Wilson, Jr. et al. | 714/724 |
| 6,081,473 A | 6/2000 | Agrawal et al. | 365/230 |
| 6,118,298 A | 9/2000 | Bauer et al. | 326/39 |
| 6,134,181 A * | 10/2000 | Landry | 365/233 |
| 6,189,115 B1 | 2/2001 | Whetsel | 714/28 |

* cited by examiner

Primary Examiner—Michael S. Lebentritt
Assistant Examiner—Anh Phung
(74) Attorney, Agent, or Firm—Christopher P. Maiorana, P.C.

(57) ABSTRACT

A circuit having an address circuit and a memory. The address circuit may be configured to (i) receive an address as a parallel input signal and as a serial input signal, (ii) present the address as an output address in one of an asynchronous mode, a synchronous mode, and a shift mode, and (iii) change the second address one by unit in a counter mode. The memory may be configured to receive the output address.

18 Claims, 8 Drawing Sheets

FLEXIBLE INPUT STRUCTURE FOR AN EMBEDDED MEMORY

FIELD OF THE INVENTION

The present invention relates to a method and/or architecture for an embedded memory generally and, more particularly, to an address input circuit for a memory block.

BACKGROUND OF THE INVENTION

Embedded memory is used for a variety of logic functions in programmable logic devices. The logic function varieties require the embedded memory to operate in one of several modes as selected by a user. For example, the embedded memory must operate in an asynchronous mode to implement lookup tables. In another example, the embedded memory must operate in a synchronous mode to implement a pipelined data storage function.

The embedded memory has an asynchronous core memory block in order to operate in the asynchronous mode. Operation in other modes requires additional circuitry connected to the inputs of the memory block to perform a desired logic function. For example, a dedicated counter is implemented to allow the memory block to be accessed in a sequential or burst mode. A separate input register is implemented to provide for synchronous input operations. As a result, considerable area is consumed by the additional circuitry and one or more registers required to make the embedded memory flexible.

SUMMARY OF THE INVENTION

The present invention concerns a circuit having an address circuit and a memory. The address circuit may be configured to (i) receive an address as a parallel input signal and as a serial input signal, (ii) present the address as an output address in one of an asynchronous mode, a synchronous mode, and a shift mode, and (iii) change the second address by one unit in a counter mode. The memory may be configured to receive the output address.

The objects, features and advantages of the present invention include providing an address input circuit to a memory block that may (i) access the memory block in an asynchronous, synchronous, counter, and shift mode, (ii) require only one register per address bit, (iii) provide for sequential configuration of data within the memory block, and/or (iv) support scan operations to verify proper operation of the registers.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
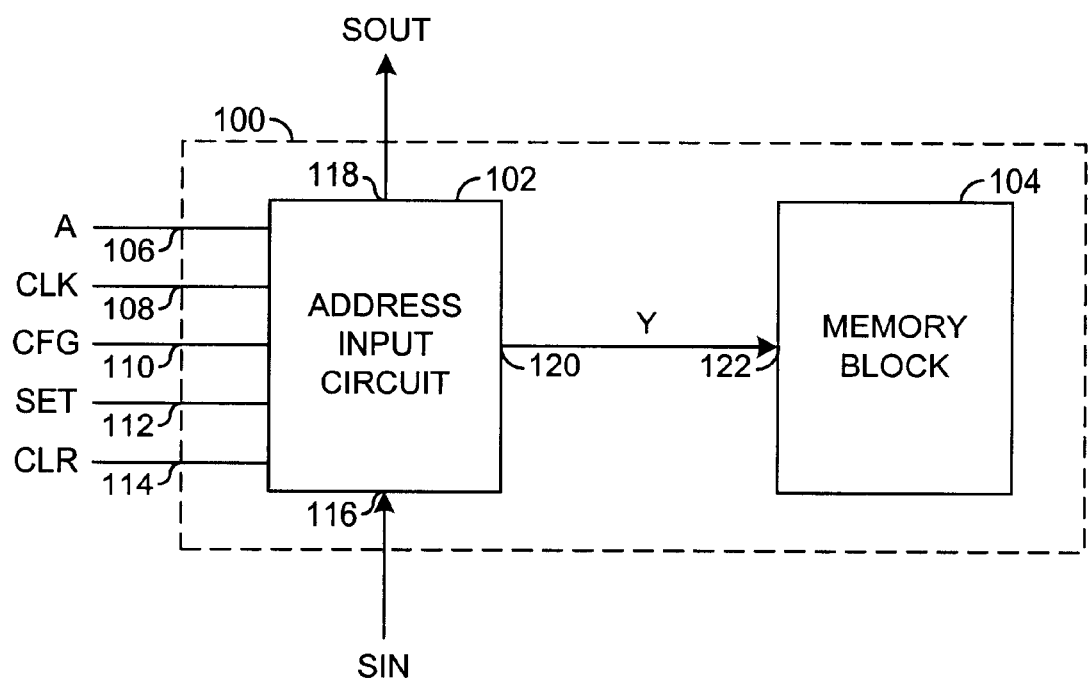
FIG. 1 is a block diagram of a memory circuit.

Referring to FIG. 1, a block diagram of a memory circuit 100 is shown in accordance with a preferred embodiment of the present invention. The memory circuit 100 generally comprises an address input circuit 102 and a memory block 104. The address input circuit 102 generally provides for one or multiple addressing modes to the memory block 104. The memory block 104 may provide for storage of data, code, tables, transformations, and other binary information. The memory block 104 is generally implemented as an asynchronous memory. Other types of memory blocks 104 may be implemented to meet the design criteria of a particular application.

The address input circuit 102 may have an input 106 to receive a signal (e.g., A). The address input circuit 102 may have an input 108 to receive another signal (e.g., CLK). The address input circuit 102 may have an input 110 to receive a signal (e.g., CFG). The address input circuit 102may have an input 112 to receive a signal (e.g., SET). The address input circuit 102 may have an input 114 to receive a signal (e.g., CLR). The address input circuit 102 may have an input 116 to receive a signal (e.g., SIN). The address input circuit 102 may have an output 118 to present a signal (e.g., SOUT). The address input circuit 102 may have another output 120 to present a signal (e.g., Y) to an input 122 of the memory block 104.

The signal A may be an address. The signal A is generally a multiple-bit wide parallel address. The signal Y may also be an address. The signal Y generally has the same bit-width as the signal A. The address input circuit 102 may be implemented to receive the signal A as an input address and present the signal Y as an output address. The memory block 104 may be implemented to receive the signal Y as an input address.

The signal CLK may be a clock signal. The address input circuit 102 may be sensitive to a rising edge, a falling edge, or a level of the signal CLK. In one embodiment, the signal CLK may be implemented with a 50% duty cycle. Other duty cycles may be implemented to meet the design criteria of a particular application.

The signal CFG may be a configuration signal that determines an operational mode of the address input circuit 102. The signal CFG is generally a two or more-bit signal. The signal CFG may configure the address input circuit 102 to operate in an asynchronous mode, a synchronous mode, a counter mode, and a shift mode, one mode at a time.

The signal SET may be a single-bit signal or a multiple-bit signal. As a single-bit signal, the signal SET may be used to set all of the bits of the signal Y to a logical one state. As a multiple-bit signal, each bit of the signal SET may be used to set a bit of the signal Y to the logical one state.

The signal CLR may be a single-bit signal or a multiple-bit signal. As a single-bit signal, the signal CLR may be used to clear all of the bits of the signal Y to a logical zero state. As a multiple-bit signal, each bit of the signal CLR may be used to clear a bit of the signal Y to the logical zero state.

The signal SIN may be a shift-in signal. The signal SIN is generally a multiple-bit long serial address or data. The signal SIN may be shifted into the address input circuit 102 while the address input circuit 102 is in the shift mode. Shifting of the signal SIN into the address input circuit 102 is generally performed once per cycle of the signal CLK.

The signal SOUT may be a shift-out signal. The signal SOUT is generally the signal SIN delayed in time. The signal SOUT may be shifted out of the address input circuit 102 while the address input circuit is in the shift mode. Shifting of the signal SOUT from the address input circuit 102 is generally performed once per cycle of the signal CLK.

While the address input circuit 102 is in the asynchronous mode, the signal A may be passed from the input directly through to the output 120 as the signal Y. A propagation delay through the address input circuit 102 may cause changes in the signal A to be delayed to the signal Y. In one embodiment, the address input circuit 102 may store a copy of the signal A while in the asynchronous mode. In another embodiment, the address input circuit 102 may not store a copy of the signal A while in the asynchronous mode.

While the address input circuit 102 is in the synchronous mode, the signal Y may be presented to match the signal A in synchronization with the signal CLK. Generally, the signal A should be valid for a predetermined set-up time relative to the signal CLK. For example, the set-up time may be prior to a rising edge of the signal CLK. At the rising edge of the signal CLK, the address input circuit 102 may store the signal A. A propagation delay time after the rising edge of the signal CLK, the address input circuit 102 may present the signal Y set equal to the signal A. Other synchronous relationships may be implemented between the signal A, the signal Y, and the signal CLK to meet the design criteria of a particular application.

The address input circuit 102 may present the signal Y independently of the signal A while in the counter mode. The address input circuit 102 generally presents the signal Y in an initial condition with all bits in the logical zero state. The address input circuit 102 may then increment the signal Y by one unit (e.g., a change of plus one binary) for each cycle of the signal CLK. In another embodiment, the address input circuit 102 may decrement the signal Y by one unit (e.g., a change of a minus one binary) for each cycle of the signal CLK. The initial condition of the signal Y may be set to any binary value using the signal SET, the signal CLR, the signal SIN (in the shift mode) and the signal A (in the synchronous mode). The counter mode may be useful in initializing and testing the memory block 104.

The address input circuit 102 may present the signal Y independently of the signal A while in the shift mode. The address input circuit 102 may shift-in and store an address within the 20 signal SIN. As each bit of the signal SIN is shifted through and stored in the address input circuit 102, the signal Y may be presented with the bits already stored. As with the counter mode, the initial condition of the signal Y may be controlled using the signal SET, the signal CLR, and the signal A (in the synchronous mode).

Figure 2:
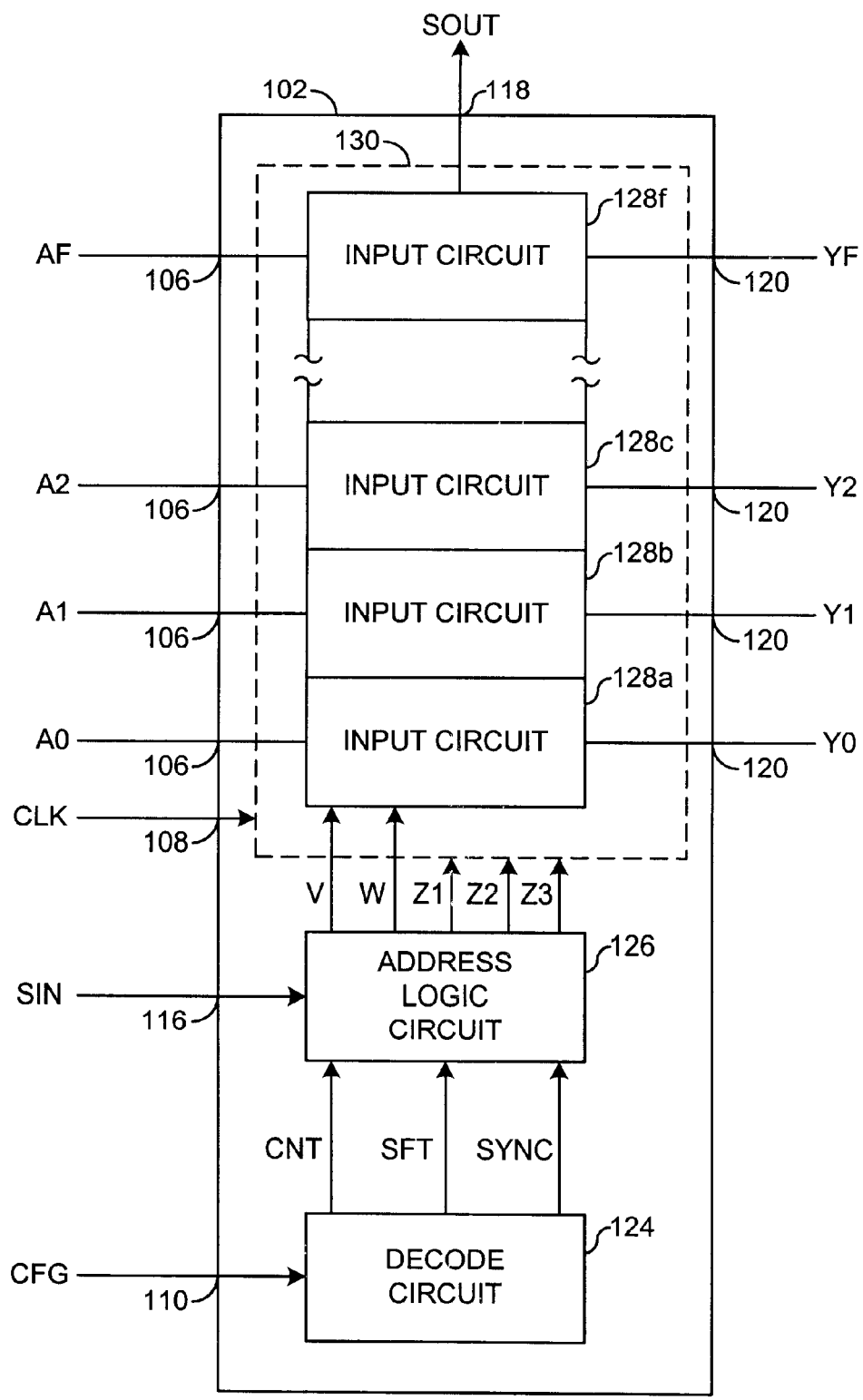
FIG. 2 is a detailed block diagram of an address input circuit.

Referring to FIG. 2, a detailed block diagram of the address input circuit 102 is shown. The address input circuit 102 may comprise a circuit 124, a circuit 126, and one or more circuits 128A–F. The circuit 124 may be a decode circuit. The circuit 126 may be an address logic circuit. Each of the circuits 128A–F may be an input circuit. A collection of the input circuits 128A–F may be referred to as an input group 130.

Each input circuit 128A–F may receive a bit of the signal A and present a bit of the signal Y. The decode circuit 124 may convert the signal CFG into multiple mode signals. The address logic circuit 126 generally provides intermediate logic between the multiple mode signals and the input group 130.

The decode circuit 124 may receive the signal CFG. The decode circuit 124 may present a signal (e.g., CNT). The decode circuit 124 may present another signal (e.g., SFT). The decode circuit 124 may present a signal (e.g., SYNC). A combination of the signal CNT, the signal SFT, and the signal SYNC may be referred to as a mode signal. The following TABLE 1 generally shows a relationship between the signal CFG and the signal CNT, the signal SFT, and the signal SYNC. The decode circuit 124 may be configured so that only one of the signal SYNC, the signal CNT, and the signal SFT is in an active state (e.g., the logical one state) at any given time.

TABLE 1

| CFG | SYNC | CNT | SFT |
| --- | --- | --- | --- |
| Asynchronous | 0 | 0 | 0 |
| Synchronous | 1 | 0 | 0 |
| Counter | 0 | 1 | 0 |
| Shift | 0 | 0 | 1 |

The address logic circuit 126 may receive the signal SIN. The address logic circuit 126 may receive the signal CNT. The address logic circuit 126 may receive the signal SFT. The address logic circuit 126 may receive the signal SYNC. The address logic circuit 126 may present a signal (e.g., V). The address logic 126 may present a signal (e.g., W) The address logic circuit 126 may present a signal (e.g., Z1). The address logic circuit 126 may present another signal (e.g., Z2). The address logic circuit 126 may present a signal (e.g., Z3).

The signal V may be used in connection with the signal W while the address input circuit 102 is in the counter mode. The signal W may be a serial input signal used to convey information such as the address or data to the input group 130 in serial fashion. The signal V and the signal W may be presented to a first input circuit 128A in the input group 130.

A combination of the signal Z1, the signal Z2, and the signal Z3 may be referred to as a control signal. The control signal may be presented to all of the input circuits 128A–F within the input group 130. The control signal may determine the mode of the input circuits 128A–F. The following TABLE 2 shows a relationship between the signal CFG, the signal SYNC, the signal CNT, the signal SFT, the signal Z1, the signal Z2, the signal Z3, the signal V, and the signal W. A table cell value of "X" may be a "don't care" value.

TABLE 2

| CFG | SYNC | CNT | SFT | Z1 | Z2 | Z3 | V | W |
| --- | --- | --- | --- | --- | --- | --- | --- | --- |
| Asynchronous | 0 | 0 | 0 | X | X | 0 | X | X |
| Synchronous | 1 | 0 | 0 | X | 0 | 1 | X | X |
| Counter | 0 | 1 | 0 | 0 | 1 | 1 | 1 | 1 |
| Shift | 0 | 0 | 1 | 1 | 1 | 1 | X | Info |

The signal Z1 may be implemented to be the same as the signal SFT. The signal Z2 may be implemented to be a logical OR of the signal SFT and the signal CNT. The signal Z3 may be implemented to be a logical OR of the signal SFT, the signal CNT and the signal SYNC. The signal V may be implemented to be the same as the signal CNT. The signal W may be implemented as a logical OR of the signal SIN and the signal CNT.

The first input circuit 128A may receive the signal V. The first input circuit 128A may receive the signal W. Each input circuit 128A–F may receive the control signal. Each input circuit 128A–F may receive a respective bit of the signal A.

Figure 3:
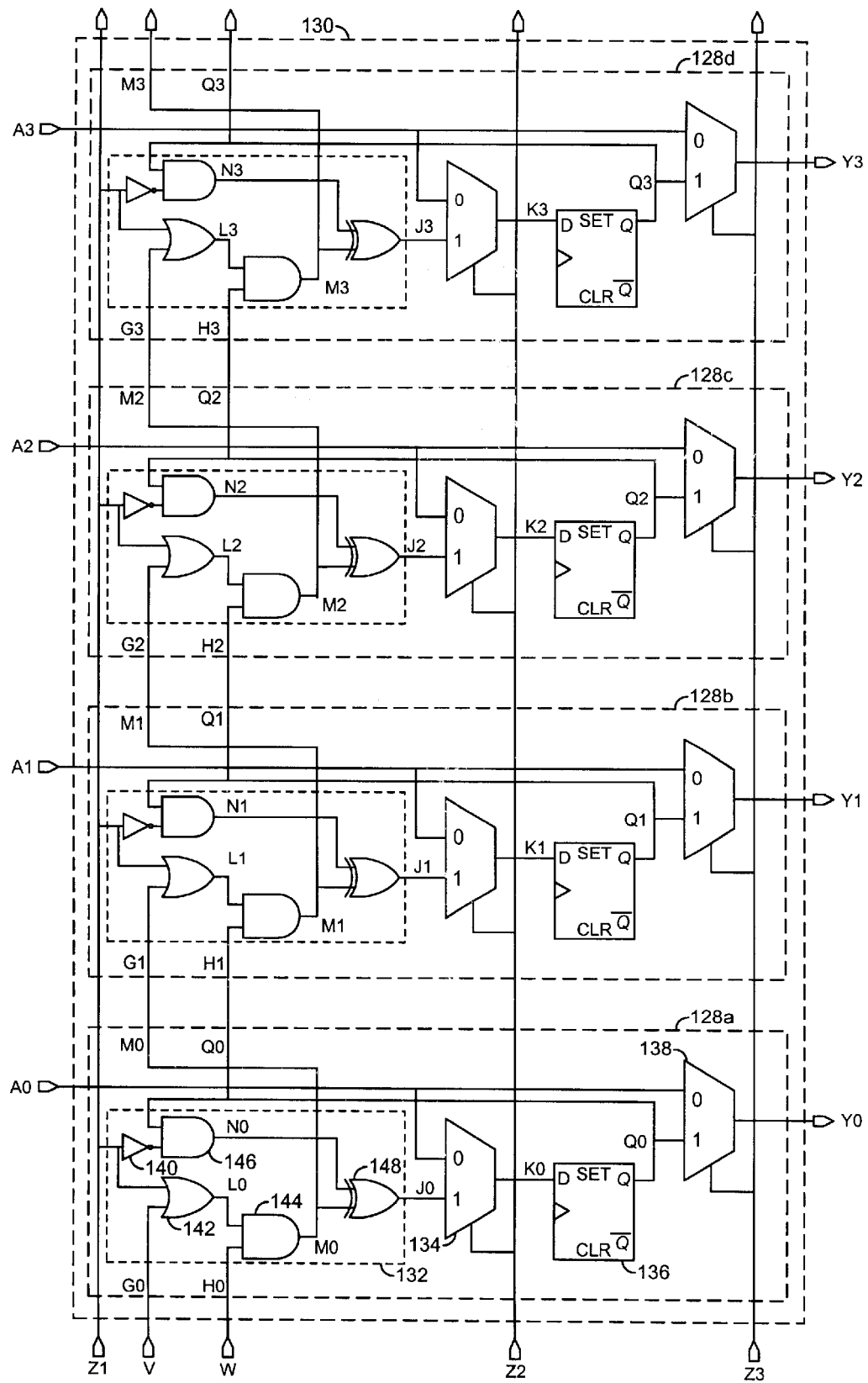
FIG. 3 is a schematic of an input circuit.

Referring to FIG. 3, a schematic of the first input circuit 128A is shown. The input circuits 128B–D are also shown in FIG. 3 for ease of understanding the various modes. Each of the input circuits 128B–F may be a copy of the first input circuit 128A. The first input circuit 128A generally comprises a circuit 132, a multiplexer 134, a register 136, and a multiplexer 138. The circuit 132 may be referred to an input logic circuit 132. The multiplexer 134 may be referred to as an internal multiplexer 134. The multiplexer 138 may be referred to as an output multiplexer 138.

The input logic circuit 132 may receive the signal Z1. The input logic circuit 132 may receive a signal (e.g., G0). The input logic circuit 132 may receive a signal (e.g., H0). The input logic circuit 132 may receive a signal (e.g., Q0) from the register 136. The input logic circuit 132 may present a signal (e.g., J0) to the internal multiplexer 134. The input logic circuit 132 may present a signal (e.g., M0) external to the input circuit 128.

The internal multiplexer 134 may receive the signal Z2 to control signal selection. The internal multiplexer 134 may receive the signal J0. The internal multiplexer 134 may receive the signal Q0. The internal multiplexer 134 may present a signal (e.g., K0) to the register 136. The signal K0 may be selected from the signal J0 and the signal Q0 based upon the signal Z2. Therefore, the signal Z2 may also be referred to as a selection signal.

The register 136 may receive the signal K0. The register 136 may receive the signal CLK. The register 136 may receive the signal CLR. The register 136 may receive the signal SET. The register may present the signal Q0 to the output multiplexer 138, the input logic circuit 132, and external to the input circuit 128 as a serial output signal.

The output multiplexer 138 may receive the signal Z3 to control signal selection. The output multiplexer 138 may receive a bit (e.g., A0) of the signal A. The output multiplexer 128 may receive the signal Q0. The output multiplexer 128 may present a bit (e.g., Y0) of the signal Y. The bit Y0 may be selected form the signal A0 and the signal Q0 based upon the signal Z3. Therefore, the signal Z3 may also be referred to as a selection signal.

The signal H0 may be a serial input signal received by the input logic circuit 132. The signal G0 may be an input signal also received by the input logic circuit 132. The signal J0 may be an internal address generated by the input logic circuit 132. The signal Q0 may be a stored address at the output of the register 136. The signal Q0 may also be a serial output signal presented externally to the input circuit 128A. The signal K0 may be the stored address at the input of the register 136. The signal M0 may be an output signal presented externally to the input circuit 128A by the input logic circuit 132.

The input logic circuit 132 generally comprises an inverter 140, a gate 142, a gate 144, a gate 146, and a gate 148. The gate 142 may be implemented as a logical OR gate. The gate 144 may be implemented as a logical AND gate. The gate 146 may be implemented as a logical AND gate. The gate 148 may be implemented as a logical exclusive OR gate.

The inverter 140 may receive the signal Z1. The inverter 140 may present an inverted signal Z1 to the gate 146. In one embodiment, the inverter 140 may be replaced by an inverting input of the gate 146. The gate 142 may receive the signal Z1. The gate 142 may receive the signal G0. The gate 142 may present a signal (e.g., L0). The gate 144 may receive the signal H0. The gate 144 may receive the signal L0. The gate 144 may present the signal M0. The gate 146 may receive the inverted signal Z1. The gate 146 may receive the signal Q0. The gate 146 may present a signal (e.g., N0). The gate 148 may receive the signal N0. The gate 148 may receive the signal M0. The gate 148 may present the signal J0.

To set the input circuits 128A–D into the asynchronous mode, the signal Z3 may be set to the logical zero state. Consequently, the output multiplexer 138 may select the signal A0 to be presented as the signal Y0. If the signal Z2 is in the logical one state, then t he signal A0 may not be stored by the register 136. If the signal Z2 is in the logical zero state, then the internal multiplexer 134 may select the signal A0 to be presented as the signal K0 to the register 136. As a result, the signal A0 may be stored by the input circuit 138 while in the asynchronous mode.

Figure 4:
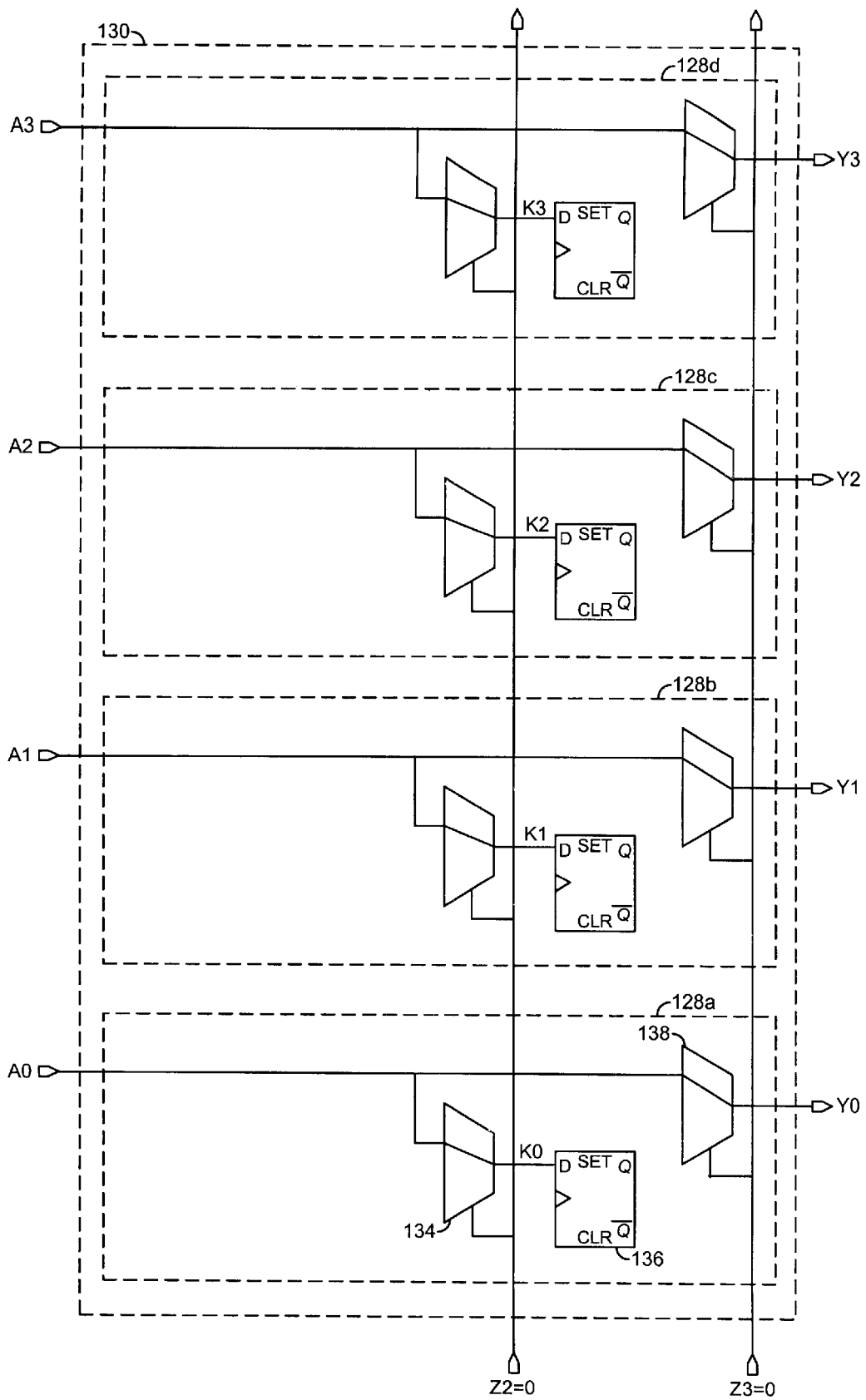
FIG. 4 is a schematic highlighting an address path through the input circuit in an asynchronous mode.

Referring to FIG. 4, a schematic is shown highlighting an address path through the input circuits 128A–D while the signal Z1, the signal Z2, and the signal Z3 are in the logical zero state (e.g., the asynchronous mode). In the asynchronous mode, the input circuits 128A–D may present the signals Y0–Y3 as the signals A0–A3 while introducing only a propagation delay. Because the signal Z2 is in the logical zero state, the register 136 in each of the input circuits 128A–D may periodically store the respective signal A0–A3.

Referring again to FIG. 3, to set the input circuits 128A–D into the synchronous mode, the signal Z3 may be set to the logical one state and the signal Z2 may be set to the logical zero state. Consequently, the signal A0 may be selected by the internal multiplexer 134 to be presented as the signal K0 to the register 136. During a subsequent cycle of the signal CLK, the signal K0 may be stored in the register 136 and presented as the signal Q0. The output multiplexer 138 may select the signal Q0 to be presented as the signal Y0.

Figure 5:
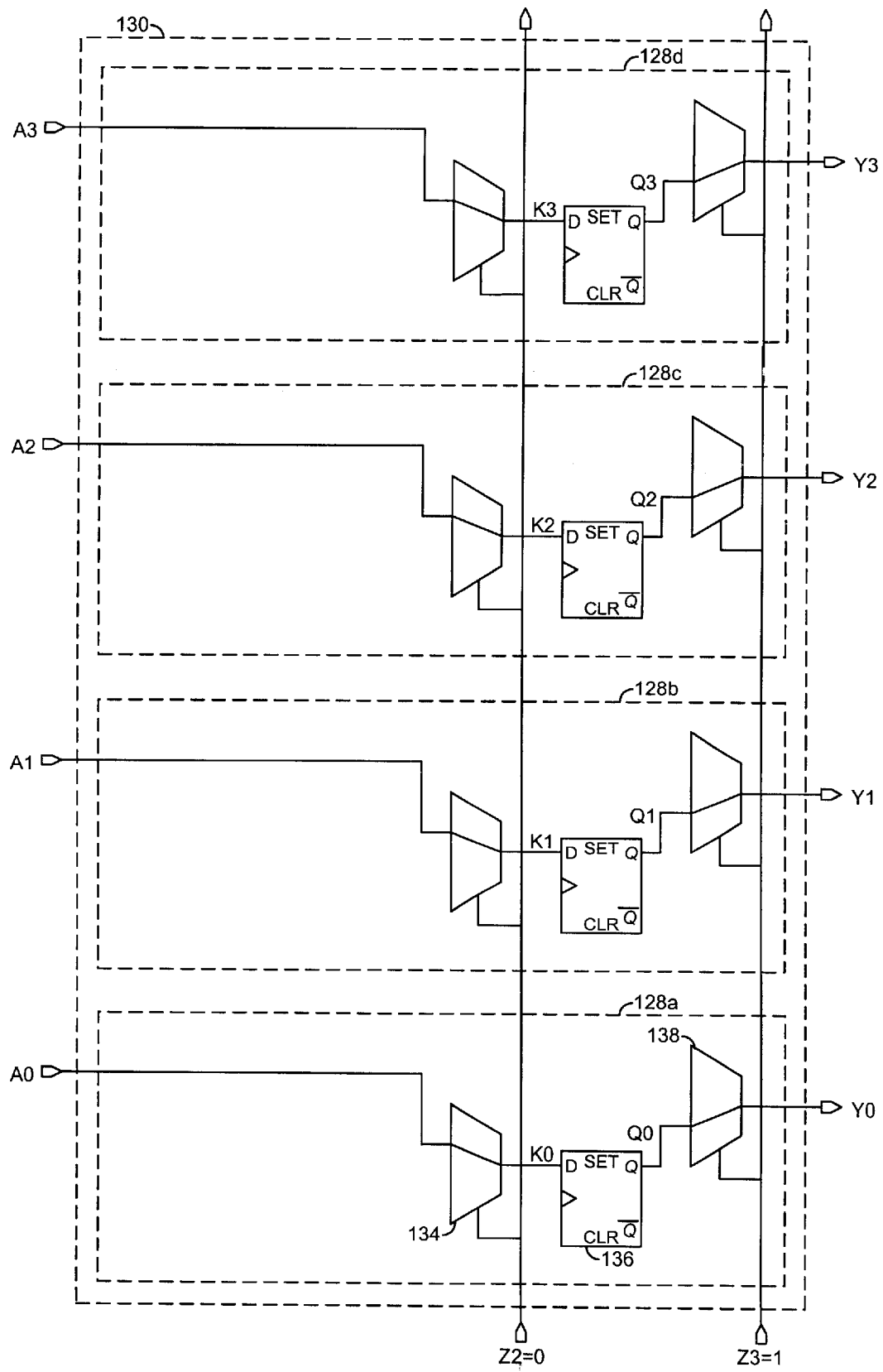
FIG. 5 is a schematic highlighting an address path through the input circuit in a synchronous mode.

Referring to FIG. 5, a schematic is shown highlighting an address path through the input circuits 128A–D while the signal Z1 is in the logical zero state, the signal Z2 is in the logical zero state, and the signal Z3 is in the logical one state (e.g., the synchronous mode). In the synchronous mode, the input circuits 128A–D may store the signals A0–A3 in synchronization with the signal CLK. Once stored, the signals A0–A3 may then be presented as the signals Y0–Y3.

Referring again to FIG. 3, to set the input circuits 128A–D into the counter mode, the signal Z3 may be set to the logical one state, the signal Z2 may be set to the logical one state, and the signal Z1 may be set to the logical zero state. While the signal Z1 is in the logical zero state, gate 142 passes the signal G0 through to the gate 144 and gate 146 passes the signal Q0 through to the gate 148. While the signal Z2 is in the logical one state, the internal multiplexer 134 may pass the signal J0 through to the register 136. The signal M0 may now represent a logical AND of the signal G0 and the signal H0. In general, the signal Mj (where j is an integer greater than or equal to one) may represent a logical AND of the signal Gj and the signal Hj. The signal Gj may represent a logical AND of all of the signals Qi (where i is an integer in the range j>i>=0) from lower-bit input circuits 128 (e.g., G3=Q0·Q1·Q2). The signal Qj may represent the logical state of the current input circuit 128i.

Figure 6:
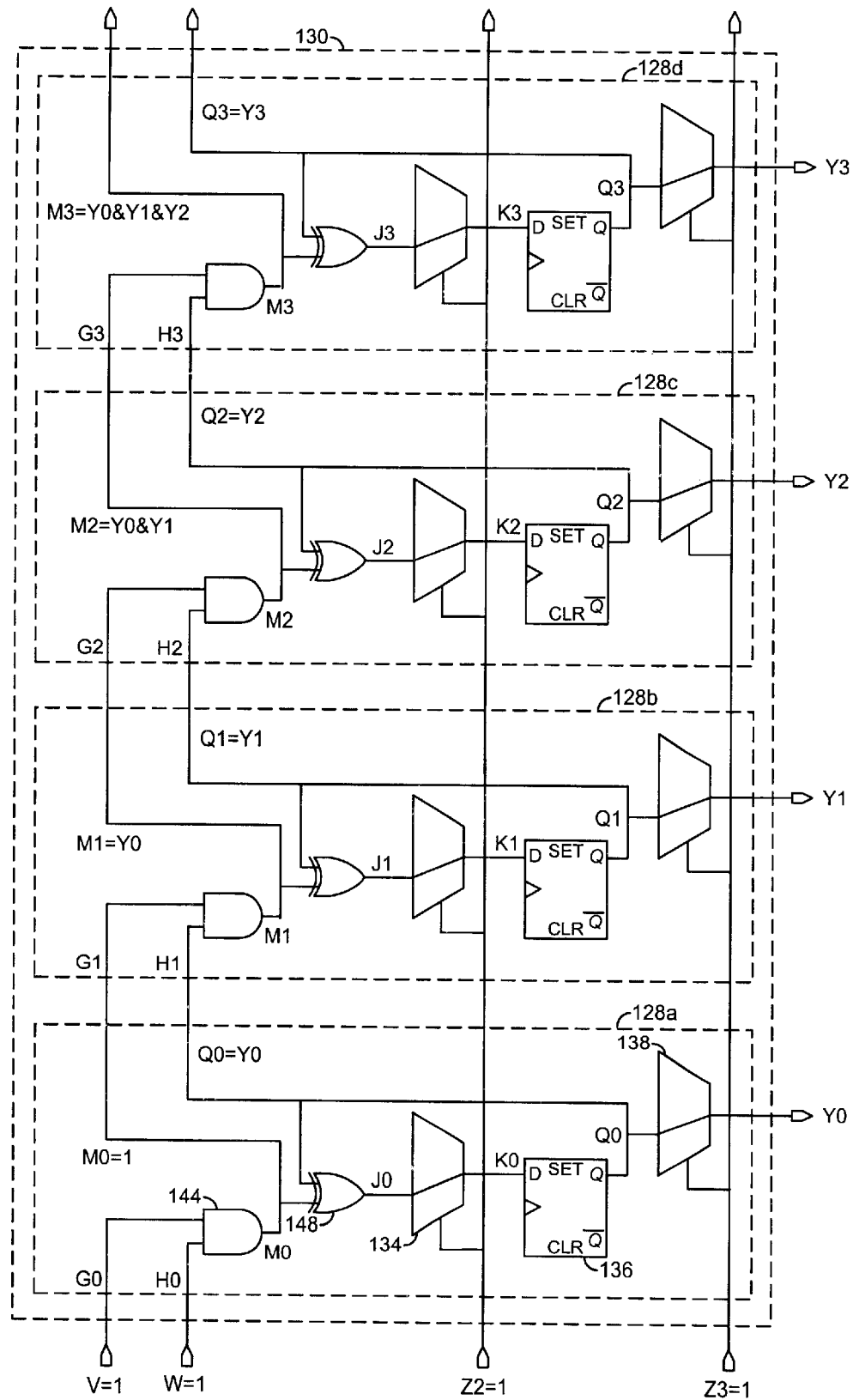
FIG. 6 is a schematic highlighting an address path through the input circuit in a counter mode.

Referring to FIG. 6, a schematic is shown highlighting an address path through the input circuits 128A–D while the signal Z1 is in the logical zero state, the signal Z2 is in the logical one state, and the signal Z3 is in the logical one state (e.g., the counter mode). For the first input circuit 128A, the signal G0 may be set equal to the signal V presented by the address logic circuit 126. For the first input circuit 128A, the signal H0 may be set equal to the signal W presented by the address logic circuit 126.

If the signal Gj and the signal Hj are both in the logical one state (e.g., all signals Qi may be in the logical one state), then the signal Mj may be in the logical one state. While the signal Mj is in the logical one state, the gate 148 may present the signal Jj as the signal Qj inverted. As a result, the register 136 may toggle the state of the signal Qj during a next cycle of the signal CLK. The signal G0 and the signal H0 of the first input circuit 128A may both be set to the logical one state to cause the first input circuit 128A to toggle the signal Y0 on each cycle of the signal CLK.

While one or both of the signal Gj and the signal Hj are in the logical zero state (e.g., at least one signal Qi may be in the logical zero state), then the signal Mj may be in the logical zero state. Consequently, the gate 148 may present the signal Jj equal to the signal Qj. Therefore, the register 136j may maintain the state of the signal Qj for the next cycle of the signal CLK.

Referring again to FIG. 3, to set the input circuits 128A–D into the shift mode, the signal Z3, the signal Z2 and the signal Z1 may be set to the logical one state. While the signal Z1 is in the logical one state, the gate 144 and the gate 148 may pass the signal H0 through to the internal multiplexer 134. While the signal Z2 is in the logical one state, the internal multiplexer 134 may pass the signal H0 through to the register 136.

Figure 7:
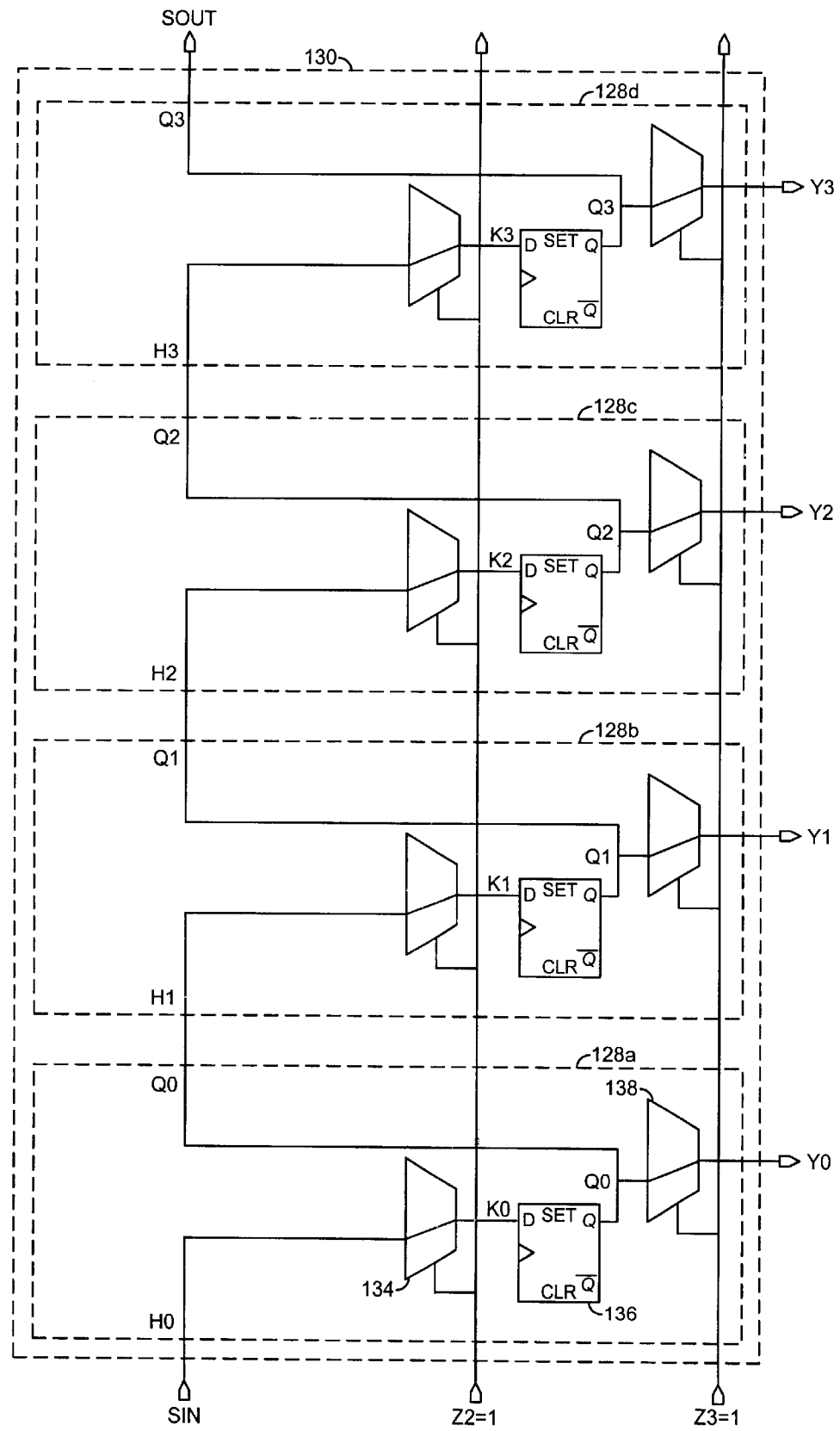
FIG. 7 is a schematic highlighting an address path through the input circuit in a shift mode.

Referring to FIG. 7, a schematic is shown highlighting an address path through the input circuits 128A–D while the signal Z1 is in the logical one state, the signal Z2 is in the logical one state, and the signal Z3 is in the logical one state (e.g., the shift mode). An address may be presented in serial fashion to the first input circuit 128 as the signal H0 (e.g., H0=W). During a first cycle of the signal CLK, a first bit of the address may be stored in the register 136 of the first input circuit 128A. The register 136 may present the first bit of the address as the signal Q0. The signal Q0 may be presented to the second input circuit 128B as the signal H1.

During a second cycle of the signal CLK, the first bit of the address may be stored in the register of the second input circuit 128B. Simultaneously, a second bit of the address may be stored in the register 136 of the first input circuit 128A. The process may be repeated indefinitely on subsequent cycles of the signal CLK. The signal Q3 may be presented externally to the input group 130 as the signal SOUT.

Figure 8:
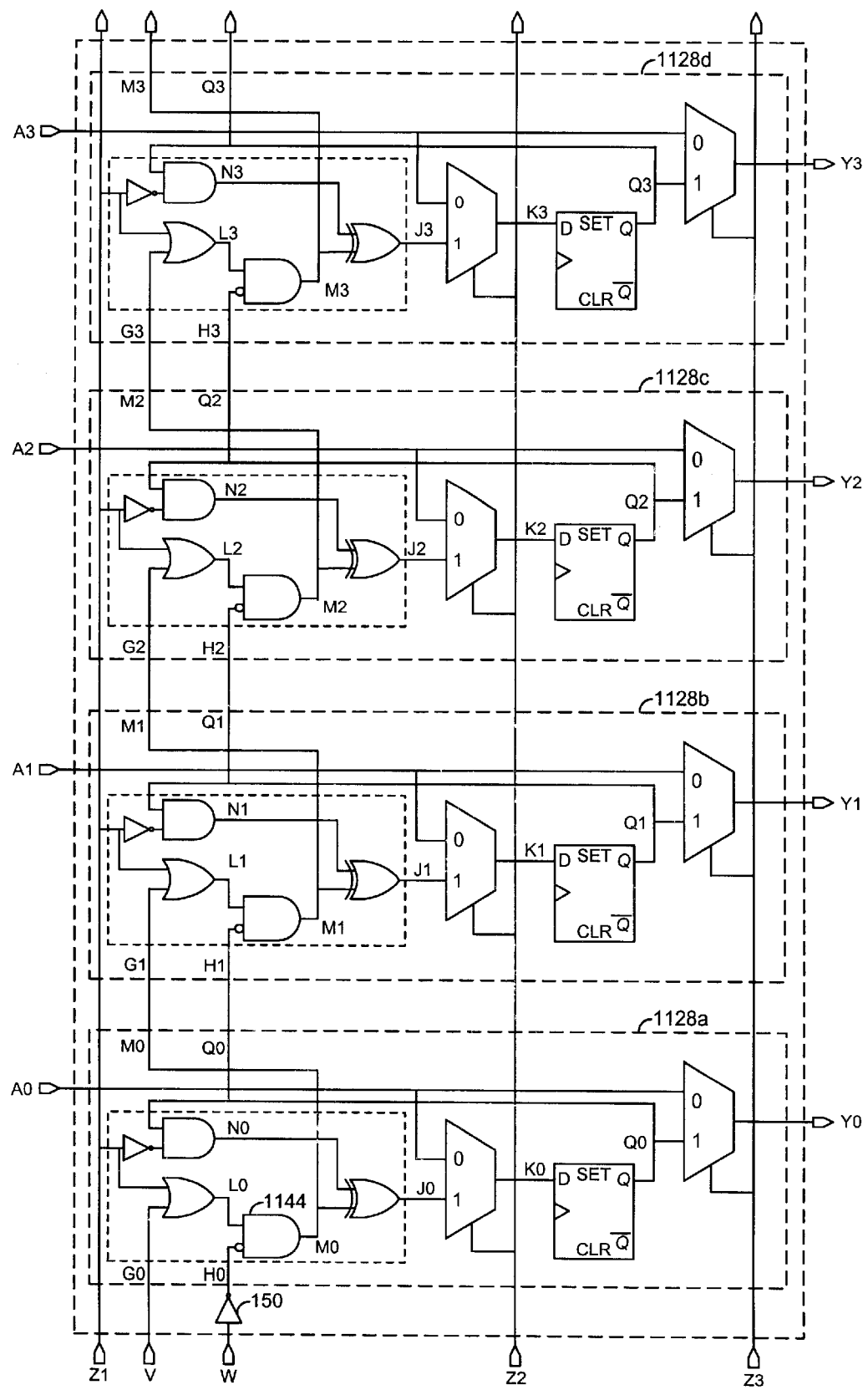
FIG. 8 is a schematic of the input circuit configured to implement a count down mode.

Referring to FIG. 8, a schematic of four input circuits 1128A–D is shown. The input circuits 1128A–D may be implemented to perform a count down while in the counter mode. The input circuit 1128A may differ from the input circuit 128A in that the gate 1144 may have an inverting input to receive the signal H0. The same difference may exist for the other input circuits 1128B–D. A first inverter 150 may be required to invert the signal W to present the signal H0. A second inverter (not shown) may be required to invert the signal Q3 to present the signal SOUT. If an odd number of input circuits 1128 are used, then the second inverter may not be required.

The various signals of the present invention are generally "on" (e.g., a digital HIGH, one, or 1) or "off" (e.g., a digital LOW, zero, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   an address circuit configured to (i) receive an address as a parallel input signal and as a serial input signal, (ii) present said address as an output address in one of an asynchronous mode, a synchronous mode, and a shift mode, and (iii) change said second address by one unit in a counter mode; and
   a memory configured to receive said output address.

2. The circuit according to claim 1, wherein said address circuit comprises:
   an input circuit configured to (i) receive said address as said parallel input signal, (ii) receive said address as said serial input signal, (iii) receive a control signal to select among said asynchronous mode, said synchronous mode, said shift mode, and said count mode, and (iv) present said output address; and
   a logic circuit configured to (i) receive said address as said serial input signal, (ii) receive a mode signal, (iii) present said serial input signal to said input circuit, and (iv) present said control signal to said input circuit.

3. The circuit according to claim 2, wherein said address circuit further comprises a second input circuit, and said input circuit is further configured to present a serial output signal to said second input circuit.

4. The circuit according to claim 2, wherein said input circuit comprises:
   a second logic circuit configured to (i) receive said serial input signal, a stored address, a shift mode signal, and a counter mode signal and (ii) present an internal address;
   a first multiplexer configured to present said stored address as selected from said address and said internal address;
   a register configured to store and present said stored address; and
   a second multiplexer configured to present said output address as selected from said address and said stored address.

5. The circuit according to claim 4, wherein said second logic circuit comprises:
   a first gate configured to present a first signal in response to said shift mode signal and said count mode signal;
   a second gate configured to present a second signal in response to said first signal and said serial input signal;
   a third gate configured to present a third signal in response to said shift mode signal and said stored address; and
   a fourth gate configured to present said internal address in response to said second signal and said third signal.

6. The circuit according to claim 5, further comprising an inverter configured to invert said serial input signal prior to said first gate.

7. The circuit according to claim 2, wherein said mode signal comprises:
   a synchronous mode signal;
   a shift mode signal; and
   a counter mode signal, wherein only one of said synchronous mode signal, said shift mode signal, and said counter mode signal is active at any one time.

8. The circuit according to claim 7, wherein said control signal comprises:

a first selection signal responsive to said synchronous mode signal, said shift mode signal, and said counter mode signal;

a second selection signal responsive to said shift mode signal and said counter mode signal; and said shift mode signal.

9. The circuit according to claim 1, wherein said one unit is plus one binary.

10. The circuit according to claim 1, where said one unit is minus one binary.

11. A method of manipulating an address prior to presentation to a memory, the method comprising the steps of:

(A) receiving said address as one of a parallel input signal and a serial input signal;

(B) presenting said address to said memory as an output address in one of an asynchronous mode, a synchronous mode, and a shift mode in response to step (A); and (C) changing said output address by one unit in a counter mode prior to presenting said output address to said memory.

12. The method according to claim 11, further comprising the step of presenting a serial output signal in one of said shift mode and said counter mode.

13. The method according to claim 11, further comprising the steps of:

presenting an internal address in response to receiving said serial input signal, a stored address, a shift mode signal, and a counter mode signal;

first multiplexing said address and said internal address to present said stored address;

registering said stored address in response to said first multiplexing; and second multiplexing said address and said stored address to present said output address.

14. The method according to claim 13, further comprising the steps of:

presenting a first signal in response to said shift mode signal and said count mode signal;

presenting a second signal in response to said first signal and said serial input signal;

presenting a third signal in response to said shift mode signal and said stored address; and presenting said internal address in response to said second signal and said third signal.

15. The method according to claim 14, further comprising the step of inverting said serial input signal prior to presenting said second signal.

16. The method according to claim 13, further comprising the steps of:

presenting a first selection signal for said first multiplexing in response to said shift mode signal and said counter mode signal; and presenting a second selection signal for said second multiplexing in response to a synchronous mode signal, said shift mode signal, and said counter mode signal.

17. The method according to claim 16, further comprising the step of activating only one of said synchronous mode signal, said shift mode signal, and said counter mode signal at any one time.

18. A circuit comprising:

means for receiving an address as one of a parallel input signal and a serial input signal;

means for presenting said address to a memory as an output address in one of an asynchronous mode, a synchronous mode, and a shift mode; and means for changing said output address by one unit in a counter mode prior to presenting said output address to said memory.

* * * * *